(12) United States Patent
Cao et al.

(10) Patent No.: US 10,910,498 B2
(45) Date of Patent: Feb. 2, 2021

(54) ARRAY SUBSTRATE, METHOD FOR FABRICATING THE SAME AND DISPLAY DEVICE

(71) Applicant: BOE Technology Group Co., Ltd., Beijing (CN)

(72) Inventors: Zhanfeng Cao, Beijing (CN); Feng Zhang, Beijing (CN); Qi Yao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 525 days.

(21) Appl. No.: 14/772,876

(22) PCT Filed: Nov. 21, 2014

(86) PCT No.: PCT/CN2014/091906
§ 371 (c)(1),
(2) Date: Sep. 4, 2015

(87) PCT Pub. No.: WO2016/015415
PCT Pub. Date: Feb. 4, 2016

(65) Prior Publication Data
US 2016/0197191 A1    Jul. 7, 2016

(30) Foreign Application Priority Data

Jul. 31, 2014 (CN) .......................... 2014 1 0373777

(51) Int. Cl.
*H01L 29/786* (2006.01)
*H01L 27/12* (2006.01)
(Continued)

(52) U.S. Cl.
CPC ...... *H01L 29/7869* (2013.01); *H01L 27/1225* (2013.01); *H01L 27/1288* (2013.01);
(Continued)

(58) Field of Classification Search
CPC ............ H01L 29/41733; H01L 27/1288; H01L 2227/323; H01L 27/3248; H01L 27/1225; G02F 1/134372; G02F 1/134363
See application file for complete search history.

(56) References Cited

U.S. PATENT DOCUMENTS 7,995,182 B2    8/2011 Choi
2004/0121578 A1*  6/2004 Nam ................ H01L 21/76808
                                            438/622
(Continued)

FOREIGN PATENT DOCUMENTS

CN    102163607 A    8/2011
CN    102236179 A    11/2011
(Continued)

OTHER PUBLICATIONS

May 11, 2015—International Search Report and Written Opinion Appn PCT/CN2014/091906 with English Tran.
(Continued)

*Primary Examiner* — Samuel A Gebremariam
*Assistant Examiner* — Jonas T Beardsley
(74) *Attorney, Agent, or Firm* — Banner & Witcoff, Ltd.

(57) ABSTRACT

An array substrate, a method for fabricating the same and a display device are disclosed. The method for fabricating the array substrate includes: forming a pattern of a gate electrode, a pattern of a gate insulation layer and a pattern of a metal oxide semiconductor active layer on a base substrate; forming an etch stop layer; forming a pattern of a pixel electrode first, and then forming a pattern of a source electrode and a pattern of a drain electrode; wherein the pattern of the pixel electrode is connected to the pattern of the metal oxide semiconductor active layer through the pattern of the source electrode or the pattern of the drain electrode. The method can prevent the problem that the (Continued)

pattern of the pixel electrode failing to connect to the pattern of the source electrode or the pattern of the drain electrode.

12 Claims, 9 Drawing Sheets

(51) Int. Cl.
    *H01L 29/423*    (2006.01)
    *H01L 29/45*     (2006.01)
    *H01L 29/49*     (2006.01)
    *H01L 29/66*     (2006.01)
    *H01L 21/311*    (2006.01)
    *H01L 21/3105*   (2006.01)
    *H01L 21/027*    (2006.01)

(52) U.S. Cl.
    CPC ........ *H01L 29/42356* (2013.01); *H01L 29/45* (2013.01); *H01L 29/495* (2013.01); *H01L 29/4908* (2013.01); *H01L 29/66969* (2013.01); *H01L 29/78606* (2013.01); *H01L 21/0274* (2013.01); *H01L 21/31058* (2013.01); *H01L 21/31144* (2013.01)

(56) References Cited

U.S. PATENT DOCUMENTS

| | | | | |
|---|---|---|---|---|
| 2004/0134878 A1* | 7/2004 | Matsushita | ......... | G02F 1/13458 216/23 |
| 2004/0263742 A1* | 12/2004 | Kim | ................... | G02F 1/136227 349/139 |
| 2008/0180622 A1* | 7/2008 | Horiguchi | ......... | G02F 1/134309 349/139 |
| 2010/0193790 A1* | 8/2010 | Yeo | ..................... | H01L 27/3248 257/59 |
| 2011/0175093 A1 | 7/2011 | Liou et al. | | |
| 2012/0292612 A1* | 11/2012 | Jeong | .................. | H01L 27/1225 257/43 |
| 2012/0292645 A1* | 11/2012 | Park | .................... | H01L 27/1225 257/88 |
| 2013/0015459 A1* | 1/2013 | Lee | .................... | H01L 27/3265 257/72 |

FOREIGN PATENT DOCUMENTS

| | | |
|---|---|---|
| CN | 102419499 A | 4/2012 |
| CN | 102629589 A | 8/2012 |
| CN | 103186002 A | 7/2013 |
| CN | 103367248 A | 10/2013 |
| CN | 104157613 A | 11/2014 |

OTHER PUBLICATIONS

Jun. 3, 2016—(CN) First Office Action (with English Translation)—App. No. 201410373777.2.

Nov. 22, 2016—(CN) Second Office Action Appn 201410373777.2 with English Tran.

\* cited by examiner

ARRAY SUBSTRATE, METHOD FOR FABRICATING THE SAME AND DISPLAY DEVICE

The application is a U.S. National Phase Entry of International Application No. PCT/CN2014/091906 filed on Nov. 21, 2014, designating the United States of America and claiming priority to Chinese Patent Application No. 201410373777.2, filed on Jul. 31, 2014. The present application claims priority to and the benefit of the above-identified applications and the above-identified applications are incorporated by reference herein in their entirety.

FIELD OF THE ART

Embodiments of the invention relate to an array substrate, a method for fabricating the same and a display device.

BACKGROUND

In the field of display technologies having liquid crystal displays (LCD) as a representative, due to the increases of resolution and size of the display devices and the need for low resistance wiring for integrating driver circuits in display devices, metals with low resistances, such as Cu, are used to fabricate gate lines and data lines in the display devices. Moreover, gate electrodes, source electrodes and drain electrodes in thin film transistors (TFTs) are also made of Cu.

However, as metals with low resistances such as Cu are active, the surface of Cu is easily oxidized while etching is performed to form a pixel electrode. The thickness of oxidized Cu layer would increase gradually with time. Due to the above fact, contact resistances of the source electrode and the drain electrode made of Cu will increase, making it impossible to connect the pixel electrode to the drain electrode, which will compromise the yield rate of products.

SUMMARY

A first aspect of the invention provides a method for fabricating an array substrate. The method comprises: forming a pattern of a gate electrode, a pattern of a gate insulation layer and a pattern of a metal oxide semiconductor active layer on a base substrate; forming an etch stop layer; forming a pattern of a pixel electrode first, then forming a pattern of a source electrode and a pattern of a drain electrode; wherein the pattern of the pixel electrode is connected to the pattern of the metal oxide semiconductor active layer through the pattern of the source electrode or the pattern of the drain electrode.

Another aspect of the invention provides an array substrate, comprising: a base substrate, a pattern of a gate electrode, a pattern of a gate insulation layer, a pattern of a metal oxide semiconductor active layer, a pattern of an etch stop layer, a pattern of a pixel electrode, and a pattern of a source electrode and a pattern of a drain electrode sequentially disposed on the base substrate; wherein the pattern of the etch stop layer comprises a first via hole and a second via hole, the first via hole and the second via hole are configured as respectively connecting the pattern of the source electrode and the pattern of the drain electrode to the pattern of the metal oxide semiconductor active layer; the pattern of the pixel electrode is connected to the pattern of the source electrode or the pattern of the drain electrode, and the pattern of the source electrode or the pattern of the drain electrode connected to the pattern of the pixel electrode partly overlays the pattern of the pixel electrode.

Still another aspect of the invention provides a display device comprising the array substrate.

The embodiments of the invention provide an array substrate, a method for fabricating the same and a display device. The method for fabricating the array substrate comprises: forming a pattern of a gate electrode, a pattern of a gate insulation layer and a pattern of a metal oxide semiconductor active layer on a base substrate; forming an etch stop layer; forming a pattern of a pixel electrode first, then forming a pattern of a source electrode and a pattern of a drain electrode; wherein the pattern of the pixel electrode is connected to the pattern of the metal oxide semiconductor active layer through the pattern of the source electrode or the pattern of the drain electrode.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

NUMERAL REFERENCES

01—array substrate; 10—pattern of gate electrode; 20—pattern of gate insulation layer; 30—pattern of metal oxide semiconductor active layer; 40—pattern of etch stop layer; 40a—etch stop layer; 401—first via hole; 402—second via hole; 50—pattern of photoresist layer; 50a—first photoresist layer; 50a1—first-photoresist-completely-retained region; 50a2—third-photoresist-completely-retained region; 50a3—third-photoresist-partially-retained region; 50a4—third-photoresist-completely-removed region; 50b—second photoresist layer; 50b1—second-photoresist-completely-retained region; 50c—fourth photoresist layer; 50c1—fourth-photoresist-completely-retained region; 60—half-tone mask; 601—completely-opaque region;

602—partially-transparent region; 603—completely-transparent region; 70—pattern of pixel electrode; 70a—transparent conductive layer; 801—pattern of source electrode; 802—pattern of drain electrode; 90—pattern of passivation layer; 100—pattern of common electrode.

DETAILED DESCRIPTION

In order to clearly illustrate the technical solution of the embodiments of the invention, the drawings of the embodiments will be briefly described in the following; it is obvious that the described drawings are only related to some embodiments of the invention and thus are not limitative of the invention. Based on the described embodiments herein, those skilled in the art can obtain other embodiment(s), without any inventive work, which should be within the scope of the invention.

Embodiments of the invention provide an array substrate, a method for fabricating the same and a display device, which can prevent the problem of a pattern of a pixel electrode fails to connect to a pattern of a source electrode or a pattern of a drain electrode due to surface oxidation of the pattern of the source electrode and the pattern of the drain electrode when active materials are used therefore.

Figure 1:
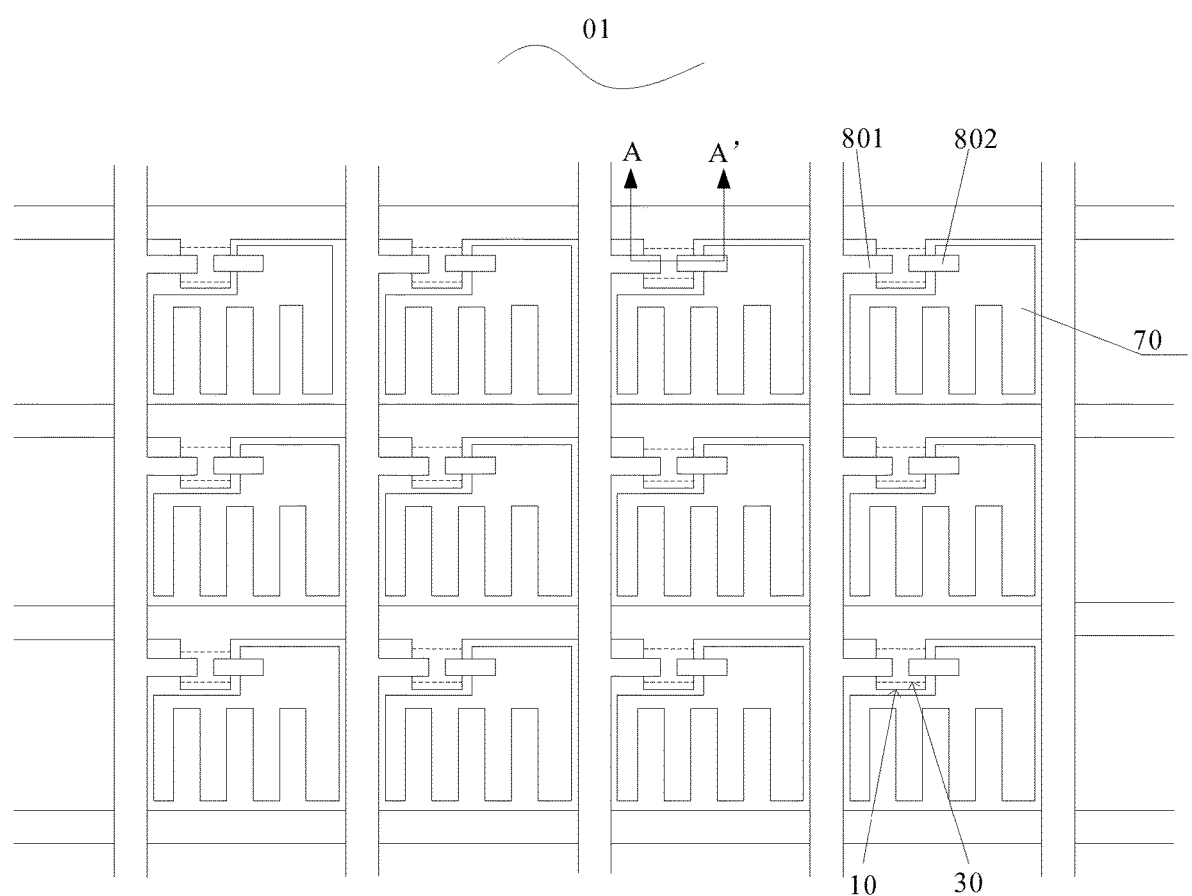
FIG. 1 schematically illustrates a top view of an array substrate in accordance with an embodiment of the invention.

As illustrated in FIG. 1, an embodiment of the invention provides a method for fabricating an array substrate. The method comprises the following steps:

S10, forming a pattern of a gate electrode 10, a pattern of a gate insulation layer (not illustrated in FIG. 1) and a pattern of a metal oxide semiconductor active layer 30 on a base substrate.

It can be contemplated that a gate line and a gate connection and the like may further be formed while the pattern of the gate electrode 10 is formed. The pattern of the gate electrode, the gate line and the gate connection may be made of relatively strong active materials having low resistances such as Cu, so as to reduce the resistances.

The pattern of the metal oxide semiconductor active layer 30 may be made of at least one of transparent metal oxide semiconductor materials including Indium Gallium Zinc Oxide (IGZO), Indium Tin Zinc Oxide (ITZO), indium oxide ($In_2O_3$) and zinc oxide (ZnO).

S11, forming an etch stop layer on the substrate done with the step S10.

S12, forming a pattern of a pixel electrode 70 first on the substrate done with the step S11, and then forming a pattern of a source electrode 801 and a pattern of a drain electrode 802; wherein the pattern of the pixel electrode 70 is connected to the pattern of the metal oxide semiconductor active layer 30 through the pattern of the source electrode 801 or the pattern of the drain electrode 802.

The pattern of the source electrode 801 and the pattern of the drain electrode 802 may be made of a material having a low resistance and a relatively strong activity such as Cu.

As Cu has rich reserves in nature and it is conductive material with relatively low resistance, the materials of the pattern of the gate electrode 10, the pattern of the source electrode 801 and the pattern of the drain electrode 802 in the embodiment of the invention are preferably Cu.

Please note the following: 1) in the embodiment of the invention, the layer finally presents on the array substrate 01 is referred to as a pattern of the layer, such as the pattern of the gate electrode 10, the pattern of the gate insulation layer, the pattern of the metal oxide semiconductor active layer 30, the pattern of the pixel electrode 70, the pattern of the source electrode 801, the pattern of the drain electrode 802 and so on. The layer in the other stages is referred to as the layer itself, such as the etch stop layer, which means corresponding operations are needed to performed on the layer so as to form the final pattern.

2) In the embodiment of the invention, the pattern of the metal oxide semiconductor active layer 30 is formed first, and then the etch stop layer is formed thereafter, finally, the pattern of the source electrode 801 and the pattern of the drain electrode 802 are formed. That is, the etch stop layer is disposed above the pattern of the metal oxide semiconductor active layer 30, while the pattern of the source electrode 801 as well as the pattern of the drain electrode 802 is disposed above the etch stop layer. As the pattern of the source electrode 801 and the pattern of the drain electrode 802 have to be connected to the pattern of the metal oxide semiconductor active layer 30, the etch stop layer has to be processed to eventually form a pattern of the etch stop layer that comprises a first via hole and a second via hole.

Based on that, those skilled in the art will understand that an etchant used on the material of the pattern of the metal oxide semiconductor active layer 30 and the etchant used on the material of the pixel electrode 70 such as ITO are the same. If the pattern of the etch stop layer comprising the first and second via holes has been formed before the pattern of the pixel electrode 70, and the pattern of the pixel electrode 70 is to be formed directly on the pattern of the etch stop layer comprising the first and second via holes, then the pattern of the metal oxide semiconductor active layer 30 exposed by the first and second via holes will inevitably be etched while etching is performed to form the pattern of the pixel electrode 70, thereby affecting the pattern of the metal oxide semiconductor active layer 30.

Based on that, the embodiment of the invention defines only that the etch stop layer is formed before the pattern of the pixel electrode 70 is formed. Whether the pattern of the etch stop layer that is finally present on the array substrate 01 and comprises the first and second via holes is formed before or after the pattern of the pixel electrode 70 is formed is not defined. That is, the pattern of the etch stop layer comprising the first and second via holes may be formed by way of a patterning process to the etch stop layer after the pattern of the pixel electrode 70 is formed. Alternatively, the pattern of the etch stop layer comprising the first and second via holes may be formed by way of a patterning process to the etch stop layer before the pattern of the pixel electrode 70 is formed, in this situation, for example, other patterns of layers overlaying the first and second via holes may be further formed, thereby preventing the influence on the pattern of the metal oxide semiconductor active layer 30 while forming the pattern of the pixel electrode 70 by etching process.

3) the pattern of the pixel electrode 70 is connected to the pattern of the metal oxide semiconductor active layer 30 through the pattern of the source electrode 801 or the pattern of the drain electrode 802, that is, on the basis that the pattern of the source electrode 801 and the pattern of the drain electrode 802 are respectively connected to the pattern of the metal oxide semiconductor active layer 30, since the pattern of the pixel electrode 70 is directly connected to the pattern of the source electrode 801 or the pattern of the drain electrode 802, thereby allowing the pattern of the pixel electrode 70 to be indirectly connected to the metal oxide semiconductor active layer 30.

The embodiment of the invention provides a method for fabricating an array substrate. The method comprises: forming a pattern of a gate electrode 10, a pattern of a gate insulation layer and a pattern of a metal oxide semiconductor active layer 30 on a base substrate; forming an etch stop layer; forming a pattern of a pixel electrode 70 first, and then forming a pattern of a source electrode 801 and a pattern of a drain electrode 802; wherein the pattern of the pixel electrode 70 is connected to the pattern of the metal oxide semiconductor active layer 30 through the pattern of the source electrode 801 or the pattern of the drain electrode 802.

On one hand, it is possible to fabricate an array substrate with a higher resolution, a better performance and a relatively big size by using the pattern of the metal oxide semiconductor active layer 30 and electrodes having low resistances. On the other hand, comparing with the conventional solutions of forming the pattern of the source electrode 801 and the pattern of the drain electrode 802 first and then forming the pattern of the pixel electrode 70, by forming the pattern of the pixel electrode 70 first and then forming the pattern of the source electrode 801 and the pattern of the drain electrode 802, it is possible to prevent the problem of the pattern of the pixel electrode 70 failing to connect to the pattern of the source electrode 801 and the pattern of the drain electrode 802 caused by the surface oxidation of the pattern of the source electrode 801 and the pattern of the drain electrode 802 due to the strong activity of the material having a low resistance.

Based on the above description, to connect the pattern of the source electrode 801 and the pattern of the drain electrode 802 to the pattern of the metal oxide semiconductor active layer 30 and to prevent the influence on the pattern of the metal oxide semiconductor active layer 30 while etching to form the pattern of the pixel electrode 70, the following two methods may be used:

The first method: between the steps S11 and S12, performing a single pattern process on the etch stop layer to form the pattern of the etch stop layer comprising the first and second via holes; and forming a pattern of a photoresist layer which is disposed outside a pixel region and overlays at least the first via hole and the second via hole.

Based on that, the step S12 can be realized through for example the following steps:

S121, forming the pattern of the pixel electrode 70 on the substrate having the pattern of the photoresist layer formed thereon, and removing the pattern of the photoresist layer to expose the first via hole and the second via hole.

Herein, since the pattern of the photoresist layer is not present in the pixel region, it is possible to remove the exposed pattern of the photoresist layer after etching off a transparent conductive film outside the pixel region (where the pattern of the pixel electrode 70 is formed).

S122, forming the pattern of the source electrode 801 and the pattern of the drain electrode 802 on the substrate having the pattern of the pixel electrode 70 formed thereon, wherein the pattern of the source electrode 801 is connected to the pattern of the metal oxide semiconductor active layer 30 through the first via hole, the pattern of the drain electrode 802 is connected to the pattern of the metal oxide semiconductor active layer 30 through the second via hole, and the pattern of the source electrode 801 or the pattern of the drain electrode 802 is connected to the pattern of the pixel electrode 70.

It is noted that, 1) the pixel region is the region where the pattern of the pixel electrode 70 is located. Based on that, what is meant by "the pattern of the photoresist layer is disposed outside the pixel region and overlays at least the first via hole and the second via hole" is that, the pattern of the photoresist layer is not present in the pixel region, and the existence of the pattern of the photoresist layer in other regions outside the pixel region is not explicitly defined, as long as it can overlay the first via hole and the second via hole.

2) The method of forming the pattern of the photoresist layer is not defined. It may be formed after the pattern of the etch stop layer is formed, or formed from the photoresist covering the etch stop layer and used in forming the pattern of the etch stop layer. The specific configuration depends on the actual situation, which will not be defined here.

The second method: during the step S12, after forming the pattern of the pixel electrode and before forming the pattern of the source electrode 801 and the pattern of the drain electrode 802, it may further perform a single patterning process on the etch stop layer, so as to form the pattern of the etch stop layer comprising the first via hole and the second via hole.

Based on that, the step of the pattern of the pixel electrode 70 being connected to the pattern of the metal oxide semiconductor active layer 30 through the pattern of the source electrode 801 or the pattern of the drain electrode 802 is as follows: the pattern of the source electrode 801 is connected to the pattern of the metal oxide semiconductor active layer 30 through the first via hole, the pattern of the drain electrode 802 is connected to the pattern of the metal oxide semiconductor active layer 30 through the second via hole, and the pattern of the source electrode 801 or the pattern of the drain electrode 802 is connected to the pattern of the pixel electrode 70.

With respect to the first method, the pattern of the photoresist layer is formed on the pattern of the etch stop layer comprising the first and second via holes, no other materials are needed when forming the pattern of the photoresist layer, thereby reducing the cost.

With respect to the second method, as the pattern of the etch stop layer only needs to comprise the first via hole which allows the pattern of the source electrode 801 to be connected to the pattern of the metal oxide semiconductor active layer 30 and the second via hole which allows the pattern of the drain electrode 802 to be connected to the pattern of the metal oxide semiconductor active layer 30, the etch stop layer formed in the step S11 can be a layer of unprocessed film. Thus, the pattern of the etch stop layer comprising the first and second via holes can be formed through a single pattern process on the film after the pattern of the pixel electrode 70 is formed and before the pattern of the source electrode 801 and the pattern of the drain electrode 802 are formed, thereby simplifying the process.

According to the first method, an embodiment of the invention provides an example to describe a process for fabricating the array substrate 01 in detail.

Figure 2:
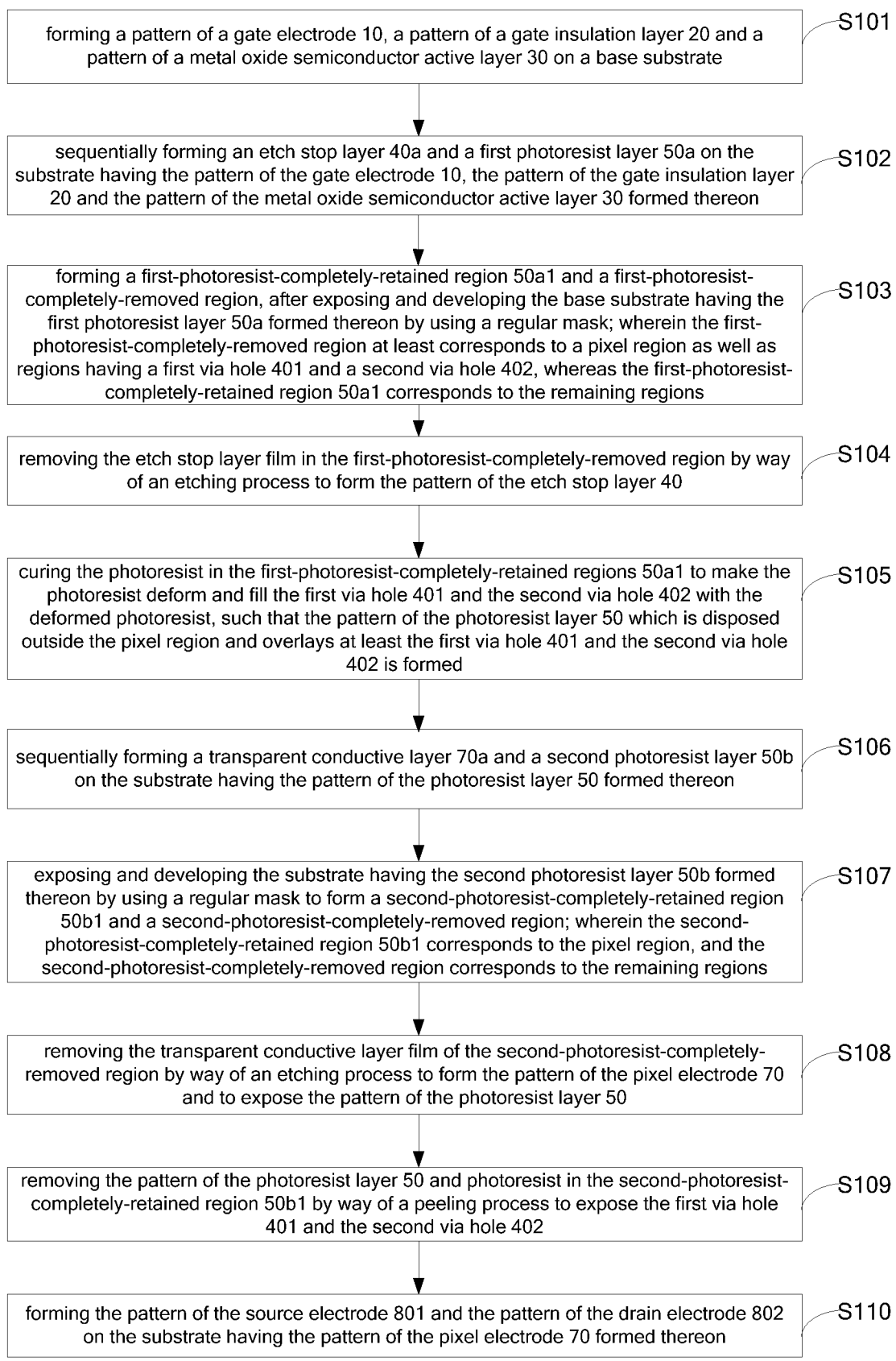
FIG. 2 schematically illustrates a flow chart of a method for fabricating an array substrate in accordance with an embodiment of the invention.
Figure 3:
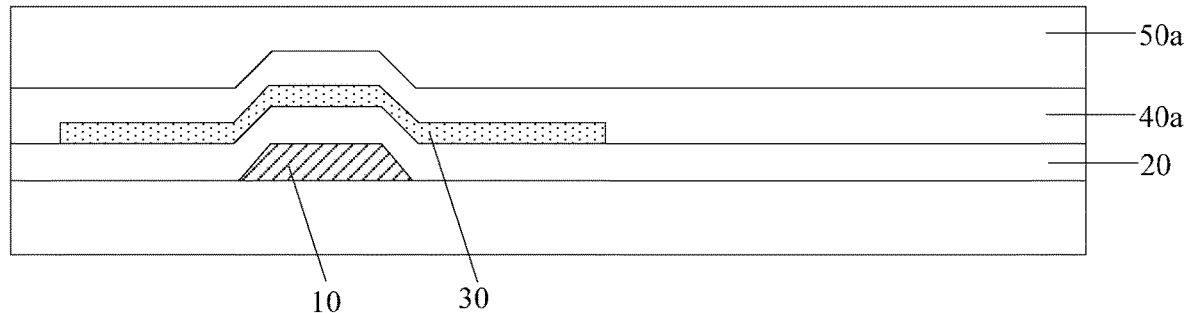
FIGS. 3 to 10 schematically illustrate cross sections of the array substrate of FIG. 1 taken along AA' during a procedure for fabricating the array substrate.

As illustrated in FIG. 2, the fabrication method comprises the following steps:

S101, as illustrated in FIG. 3, forming a pattern of a gate electrode 10, a pattern of a gate insulation layer 20 and a pattern of a metal oxide semiconductor active layer 30 on a base substrate.

S102, as illustrated in FIG. 3, sequentially forming an etch stop layer 40*a* and a first photoresist layer 50*a* on the substrate having the pattern of the gate electrode 10, the pattern of the gate insulation layer 20 and the pattern of the metal oxide semiconductor active layer 30 formed thereon.

As an example, the etch stop layer 40*a* may be made of a compact material such as silicon nitride, silicon oxide and silicon oxynitride.

Figure 4:
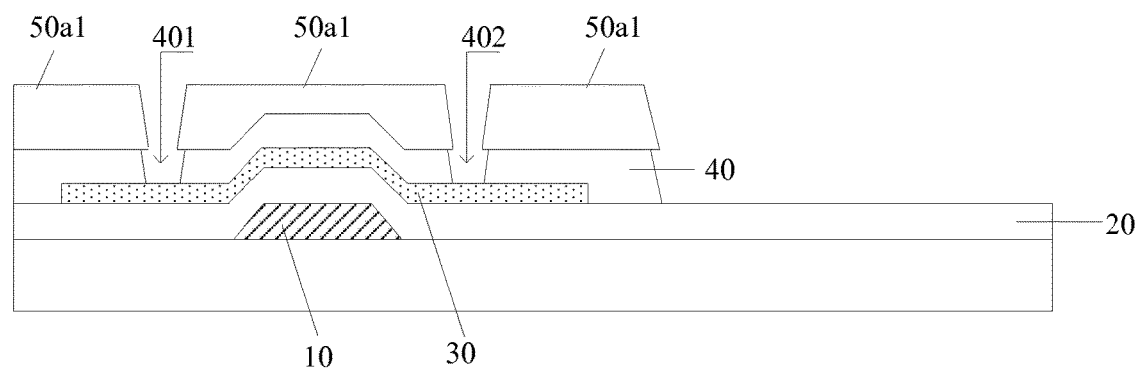

S103, as illustrated in FIG. 4, forming a first-photoresist-completely-retained region 50*a*1 and a first-photoresist-completely-removed region, after exposing and developing the base substrate having the first photoresist layer 50*a* formed thereon by using a regular mask; wherein the first-photoresist-completely-removed region at least corresponds to a pixel region as well as regions having a first via hole 401 and a second via hole 402, whereas the first-photoresist-completely-retained region 50*a*1 corresponds to the remaining regions.

S104, as illustrated in FIG. 4, removing the etch stop layer film in the first-photoresist-completely-removed region by way of an etching process to form the pattern of the etch stop layer 40.

In this step, an wet-etching process is preferably used to remove the etch stop layer film in the first-photoresist-completely-removed region, which allows a diameter of the first via hole 401 to be larger than a gap between the first-photoresist-completely-retained regions corresponding to the first via hole 401, and a diameter of the second via hole 402 to be larger than a gap between the first-photoresist-completely-retained regions corresponding to the second via hole 402.

Thus, in the following step S105, while curing the photoresist in the first-photoresist-completely-retained regions 50*a*1, it is easier to make the photoresist fill in the first via hole 401 and the second via hole 402.

It is noted that, the wet-etching process is used in this step as it has a property of anisotropy which comprises vertical etching and also lateral drill etching, thereby allowing the diameters of the first via hole 401 and the second via hole 402 to be larger than the gaps of first-photoresist-completely-retained regions 50*a*1 corresponding to the respective via holes.

Figure 5:
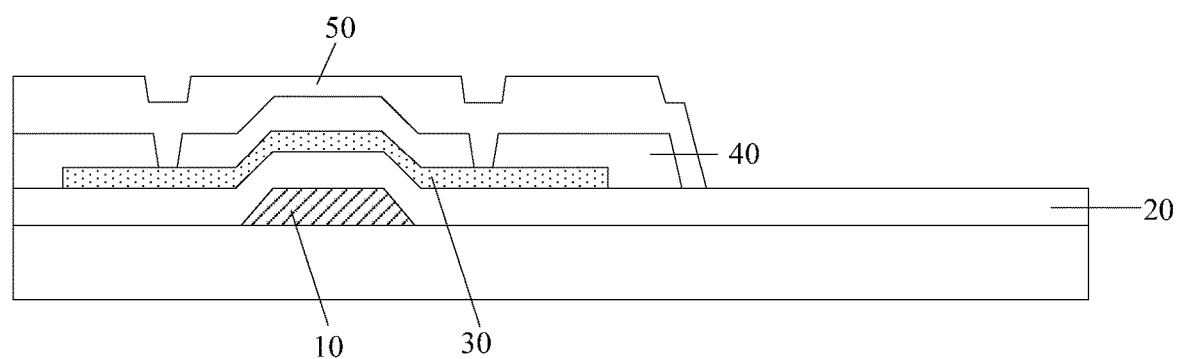

S105, as illustrated in FIG. 5, curing the photoresist in the first-photoresist-completely-retained regions 50*a*1 to make the photoresist deform and fill the first via hole 401 and the second via hole 402 with the deformed photoresist, such that the pattern of the photoresist layer 50 which is disposed outside the pixel region and overlays at least the first via hole 401 and the second via hole 402 is formed.

As an example, the photoresist in the first-photoresist-completely-retained regions 50*a*1 may be cured at a temperature of 150-180° C. for 130-200 seconds, which allows the photoresist of the first-photoresist-completely-retained regions 50*a*1 to be melted and then allows the photoresist around the first via hole 401 and the second via hole 402 to flow into the first via hole and the second via hole. That is, the photoresist of the first-photoresist-completely-retained regions 50*a*1 is deformed after the previous process, which allows the deformed photoresist to fill in the first via hole 401 and the second via hole 402, so as to form the pattern of the photoresist layer 50 which is disposed outside the pixel region and overlays at least the first via hole 401 and the second via hole 402.

It is noted that, the difference between the photoresist in the first-photoresist-completely-retained region 50*a*1 and the pattern of the photoresist layer 50 is whether the photoresist overlaying the first via hole 401 and the second via hole 402 is present in the region having the first via hole 401 and the second via hole 402.

As the etch stop layer film in the first-photoresist-completely-removed region is removed by way of the wet-etching process, the border of the formed pattern of etch stop layer 40 is recessed inwards relative to the border the first-photoresist-completely-retained region 50*a*1, the cured pattern of the photoresist layer 50 will overlay the pattern of the etch stop layer 40 which is recessed inwards relative to that.

Through the previous steps S101 to S105, during the process of forming the pattern of the etch stop layer 40, it is possible to use photoresist of the first-photoresist-completely-retained region 50*a*1 disposed above the pattern of the etch stop layer 40 to form the pattern of the photoresist 50 simply by way of a curing process, making the process relatively simple and requiring no extra patterning processes.

Figure 6:
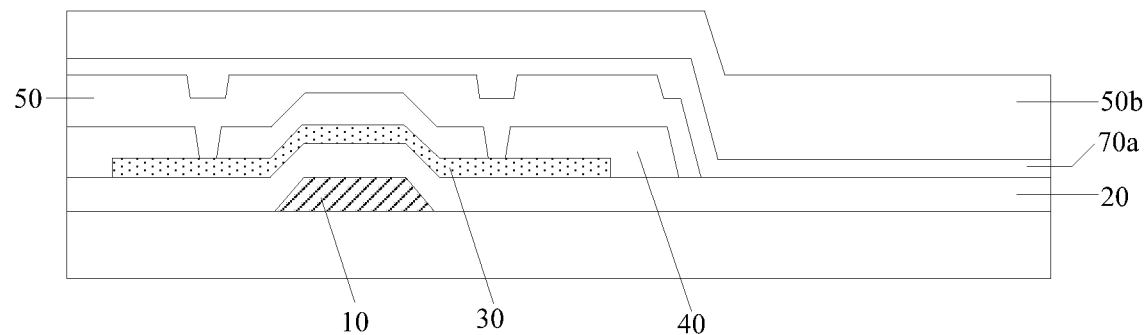

S106, as illustrated in FIG. 6, sequentially forming a transparent conductive layer 70*a* and a second photoresist layer 50*b* on the substrate having the pattern of the photoresist layer 50 formed thereon.

Figure 7:
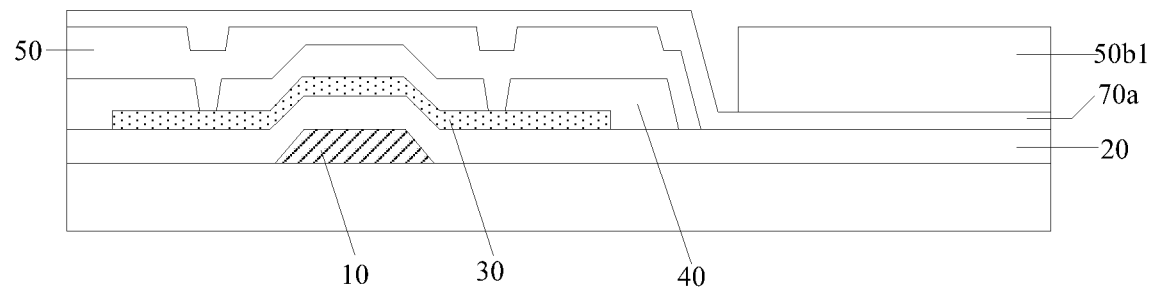

S107, as illustrated in FIG. 7, exposing and developing the substrate having the second photoresist layer 50*b* formed thereon by using a regular mask to form a second-photoresist-completely-retained region 50*b*1 and a second-photoresist-completely-removed region (not shown in FIG. 7); wherein the second-photoresist-completely-retained region 50*b*1 corresponds to the pixel region, and the second-photoresist-completely-removed region corresponds to the remaining regions.

Figure 8:
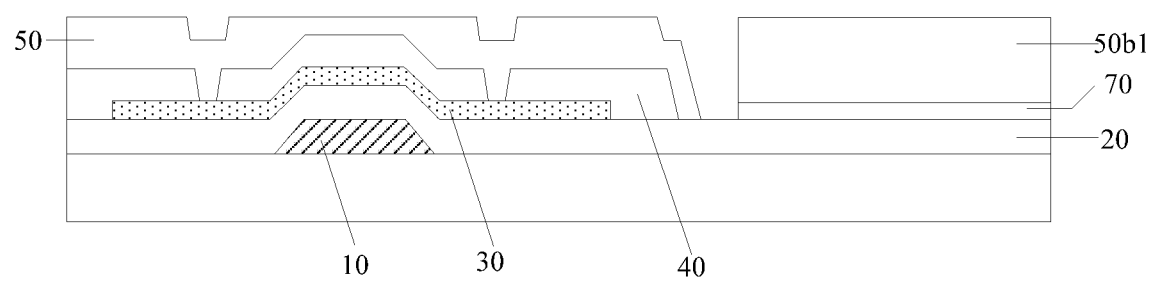

S108, as illustrated in FIG. 8, removing the transparent conductive layer film of the second-photoresist-completely-removed region by way of an etching process to form the pattern of the pixel electrode 70 and to expose the pattern of the photoresist layer 50.

Figure 9:
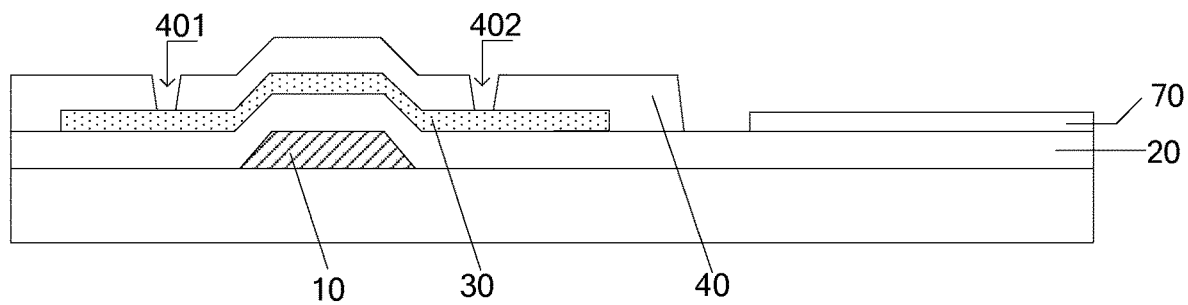

S109, as illustrated in FIG. 9, removing the pattern of the photoresist layer 50 and photoresist in the second-photoresist-completely-retained region 50*b*1 by way of a peeling process to expose the first via hole 401 and the second via hole 402.

During the above steps S106 to S109, the pattern of the photoresist layer 50 is not present under the pattern of the pixel electrode 70. Thus, even if the transparent conductive layer film is formed above the pattern of the photoresist layer 50, it is still possible to remove the pattern of the photoresist layer 50 and the photoresist of the second-photoresist-completely-retained region 50*b*1 disposed above the pattern of the pixel electrode 70 together, after the pattern of the pixel electrode 70 is formed.

S110, as illustrated 10, forming the pattern of the source electrode 801 and the pattern of the drain electrode 802 on the substrate having the pattern of the pixel electrode 70 formed thereon.

As an example, the pattern of the source electrode 801 is connected to the pattern of the metal oxide semiconductor active layer 30 through the first via hole 401, the pattern of the drain electrode 802 is connected to the pattern of the metal oxide semiconductor active layer 30 through the second via hole 402, and the pattern of the drain electrode 802 is connected to the pattern of the pixel electrode 70.

The pattern of the source electrode 801 and the pattern of the drain electrode 802 can be made of materials having low resistances and strong activity such as Cu.

It can be contemplated that, if the pixel electrode 70 is formed on the array substrate 01 only, a protection layer may be further formed to protect the pattern of the source electrode 801 and the pattern of the drain electrode 802 after the pattern of the source electrode 801 and the pattern of the drain electrode 802 are formed.

Figure 11:
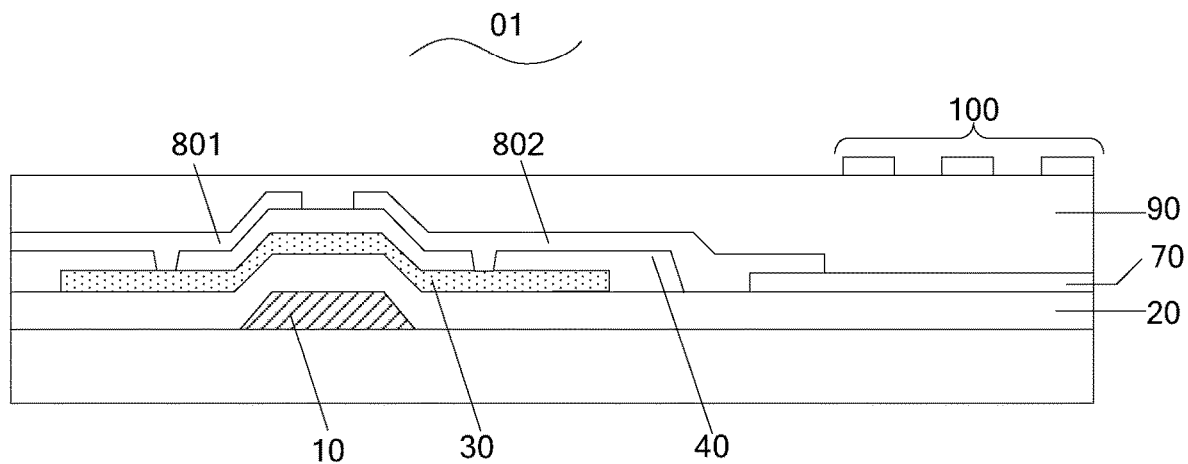
FIG. 11 schematically illustrates a configuration when forming a pattern of a common electrode and a pattern of a passivation layer on the basis of FIG. 10.

Based on the mentioned above, considering that the Advanced Super Dimension Switch technology can improve the display quality of the display panel and has advantages such as high resolution, high transmissivity, low power consumption, high aperture ratio, low chromatic aberration, no push mura and so on, as illustrated in FIG. 11, the method further comprises: forming the pattern of a passivation layer 90 and the pattern of a common electrode 100.

As an example, the following steps may be used instead of the above steps S102 to S105:

S202, as illustrated in FIG. 3, sequentially forming an etch stop layer 40a and a first photoresist layer 50a on the substrate having the pattern of the gate electrode 10, the pattern of the gate insulation layer 20 and the pattern of the metal oxide semiconductor active layer 30 formed thereon.

Figure 12:
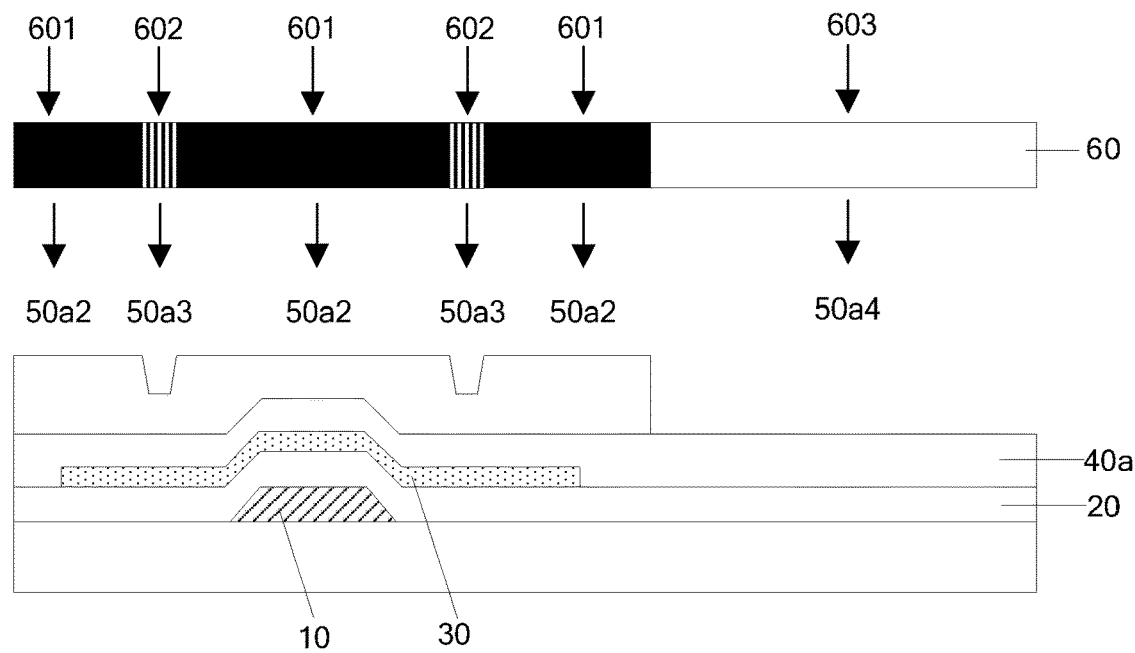
FIGS. 12 to 14 schematically illustrate cross sections of the array substrate of FIG. 1 taken along AA' during another procedure for forming a pattern of an etch stop layer and a pattern of a photoresist layer.

S203, as illustrated in FIG. 12, exposing and developing the base substrate having the first photoresist layer 50 formed thereon by using a half-tone mask 60 or a grey-tone mask and forming a third-photoresist-completely-retained region 50a2, a third-photoresist-partially-removed region 50a3 and a third-photoresist-completely-removed region 50a4; wherein the third-photoresist-completely-removed region 50a4 at least corresponds to the pixel region, the third-photoresist-partially-removed region 50a3 corresponds to regions having the first via hole and the second via hole, and the third-photoresist-completely-retained region corresponds to the remaining regions.

The first via hole 401 and the second via hole 402 are used to respectively connect the pattern of the source electrode 801 and the pattern of the drain electrode 802 to the pattern of the metal oxide semiconductor active layer 30.

With reference to FIG. 12, the half-tone mask 60 comprises a completely-opaque region 601, a partially-transparent region 602 and a completely-transparent region 603. That is: the half-tone mask 60 is a transparent substrate that has an opaque light-shielding metal layer in some regions, a partially transparent light-shielding metal layer in some other regions and no light-shielding metal layer in the remaining regions. Herein, a thickness of the partially transparent light-shielding metal layer is smaller than that of the opaque light-shielding metal layer. Furthermore, the UV-light transmissivity of the partially transparent light-shielding metal layer can be changed by adjusting the thickness of the partially transparent light-shielding metal layer.

Based on that, the operational principle of the half-tone mask 60 is described as follows: by controlling thicknesses of the light-shielding metal layers in different regions of the half-tone mask 60, it is possible to have different light intensities in different regions under the exposure, thereby selectively exposing and developing the first photoresist layer 50a to form the third-photoresist-completely-retained region 50a2, the third-photoresist-partially-removed region 50a3 and the third-photoresist-completely-removed region 50a4 which respectively correspond to the completely-opaque region 601, the partially-transparent region 602 and the completely-transparent region 603 of the half-tone mask 60.

The principle of the grey-tone mask is similar to that of the half-tone mask 60.

The photoresist in the embodiment of the invention are all positive photoresist, negative photoresist is similar thereto and will not be elaborated herein.

Figure 13:
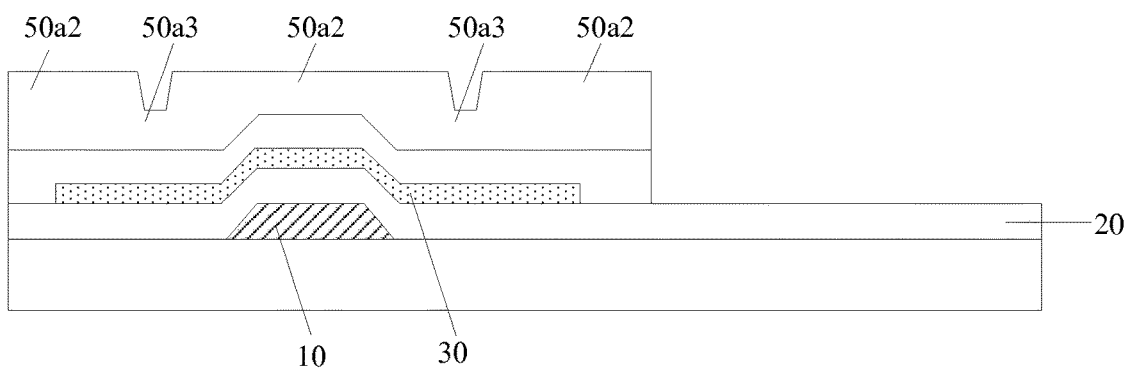

S204, as illustrated in FIG. 13, removing the etch stop layer film in the third-photoresist-completely-removed region 50a4 by way of an etching process.

Figure 14:
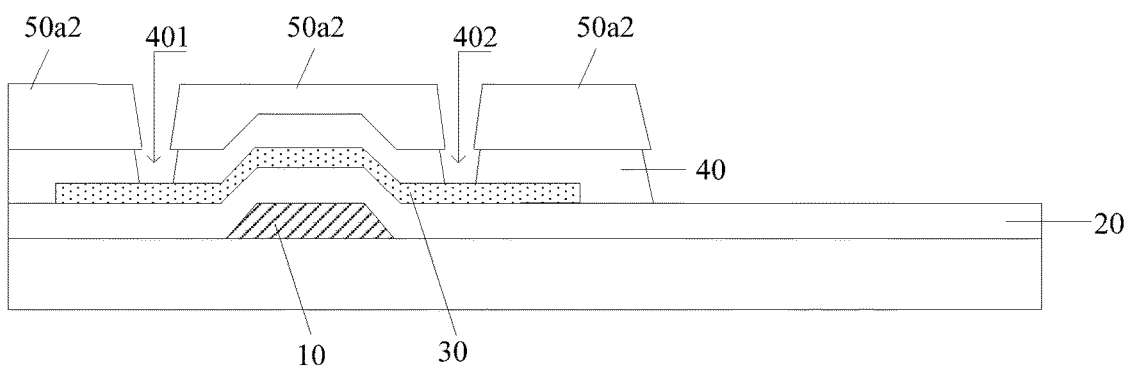

S205, as illustrated in FIG. 14, removing a photoresist in the third-photoresist-partially-removed region 50a3 by way of an ashing process, etching the etch stop layer films in the first via hole 401 and the second via hole 402 to form the pattern of the etch stop layer 40 comprising the first via hole 401 and the second via hole 402.

In this step, a wet-etching process is preferably used to remove the etch stop layer film in the region having the first via hole 401 and the second via hole 402, allowing a diameter of the first via hole 401 to be larger than a gap between third-photoresist-completely-retained regions 50a2 corresponding to the first via hole 401, and a diameter of the second via hole 402 to be larger than a gap between third-photoresist-completely-retained regions 50a2 corresponding to the second via hole 402.

Thus, in the following step S206, while curing the photoresist of the third-photoresist-completely-retained regions 50a2, it is easier to make the photoresist fill in the first via hole 401 and the second via hole 402.

S206, as illustrated in FIG. 5, curing the photoresist of the third-photoresist-completely-retained regions 50a2 to deform the photoresist and fill the first via hole 401 and the second via hole 402 with the deformed photoresist of the third-photoresist-completely-retained region 50a2, such that the pattern of the photoresist layer 50 is formed.

Based on the above, comparing with the steps S202 to S206, the steps S102 to S105 are simpler in procedure. Thus, the regular mask is preferably used to form the etch stop layer 40 and the photoresist layer 50 in the embodiment of the invention.

According to the second method, an embodiment of the invention provides an example to describe a process for fabricating the array substrate in detail.

Figure 15:
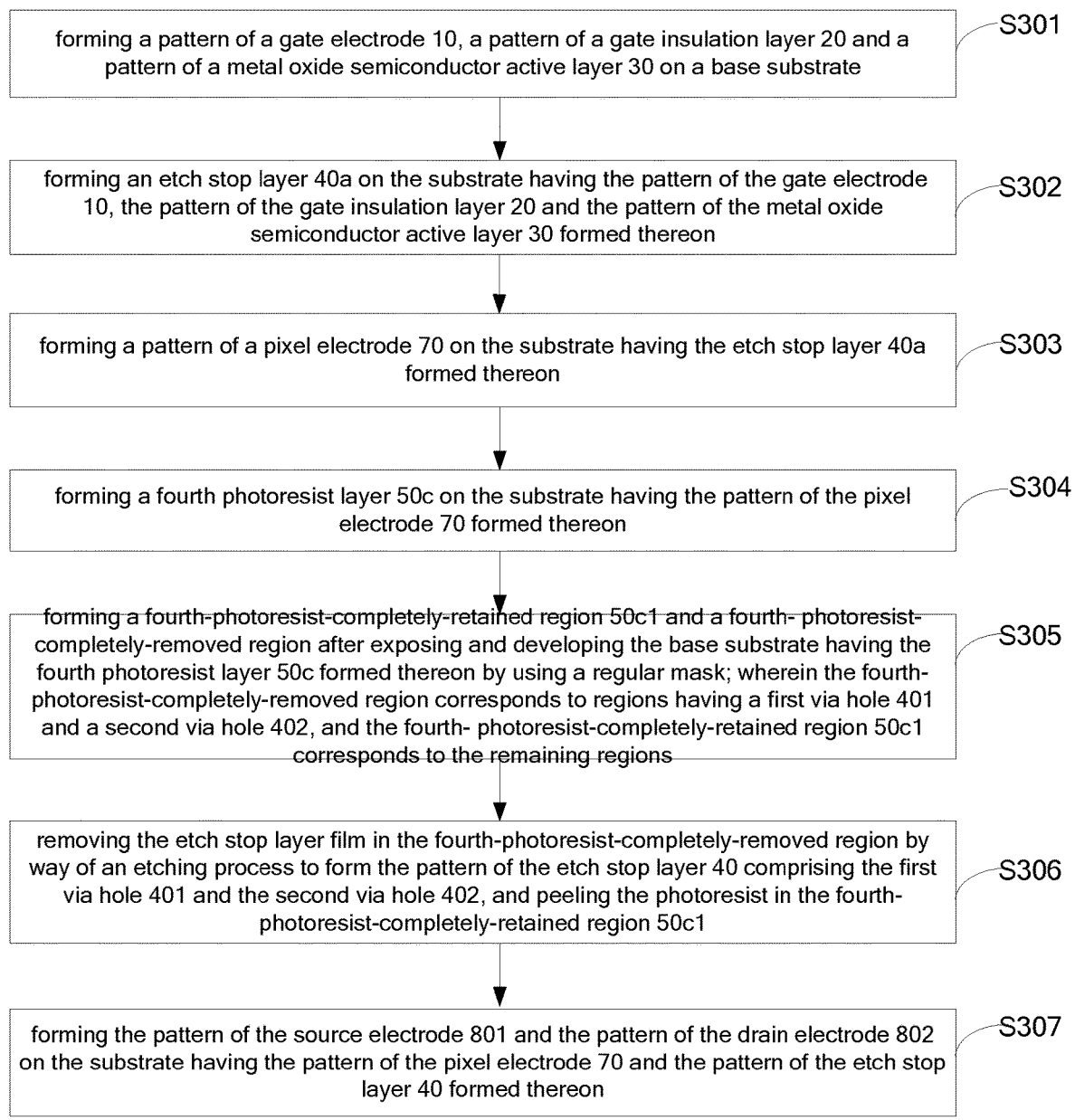
FIG. 15 schematically illustrates a flow chart of another method for fabricating an array substrate in accordance with an embodiment of the invention.

As illustrated in FIG. 15, the fabrication method comprises the following steps:

S301, as illustrated in FIG. 3, forming a pattern of a gate electrode 10, a pattern of a gate insulation layer 20 and a pattern of a metal oxide semiconductor active layer 30 on a base substrate.

Figure 16:
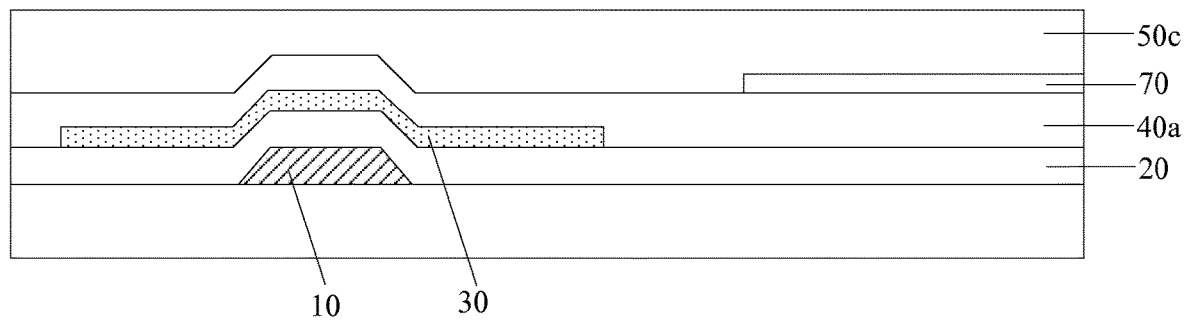
FIGS. 16 to 19 schematically illustrate cross sections of the array substrate of FIG. 1 taken along AA' during another procedure for fabricating the array substrate.

S302, as illustrated in FIG. 16, forming an etch stop layer 40a on the substrate having the pattern of the gate electrode 10, the pattern of the gate insulation layer 20 and the pattern of the metal oxide semiconductor active layer 30 formed thereon.

S303, as illustrated in FIG. 16, forming a pattern of a pixel electrode 70 on the substrate having the etch stop layer 40a formed thereon.

S304, as illustrated in FIG. 16, forming a fourth photoresist layer 50c on the substrate having the pattern of the pixel electrode 70 formed thereon.

Figure 17:
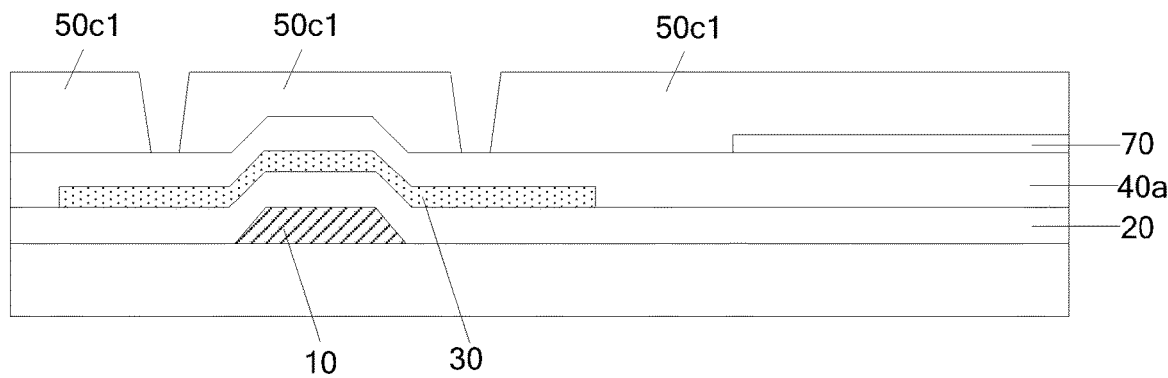

S305, as illustrated in FIG. 17, forming a fourth-photoresist-completely-retained region 50c1 and a fourth-photoresist-completely-removed region after exposing and developing the base substrate having the fourth photoresist layer 50c formed thereon by using a regular mask; wherein the fourth-photoresist-completely-removed region corresponds to regions having a first via hole 401 and a second via hole 402, and the fourth-photoresist-completely-retained region 50c1 corresponds to the remaining regions.

Figure 18:
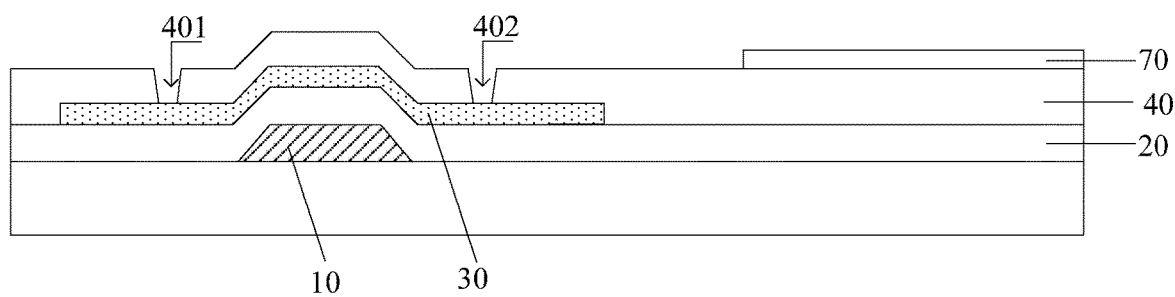

S306, as illustrated in FIG. 18, removing the etch stop layer film in the fourth-photoresist-completely-removed region by way of an etching process to form the pattern of the etch stop layer 40 comprising the first via hole 401 and the second via hole 402, and peeling the photoresist in the fourth-photoresist-completely-retained region 50c1.

Figure 19:
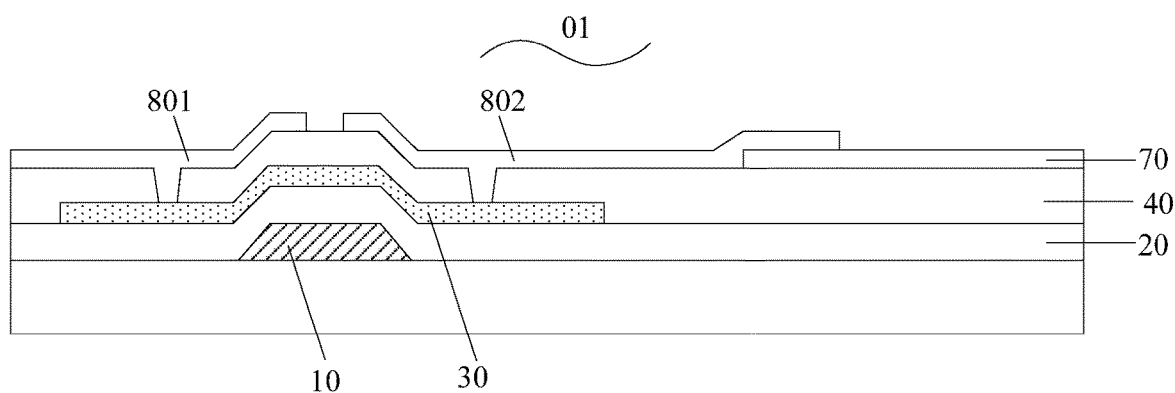

S307, as illustrated in FIG. 19, forming the pattern of the source electrode 801 and the pattern of the drain electrode 802 on the substrate having the pattern of the pixel electrode 70 and the pattern of the etch stop layer 40 formed thereon.

As an example, the pattern of the source electrode 801 is connected to the pattern of the metal oxide semiconductor active layer 30 through the first via hole 401, the pattern of the drain electrode 802 is connected to the pattern of the metal oxide semiconductor active layer 30 through the second via hole 402, and the pattern of the drain electrode 802 is connected to the pattern of the pixel electrode 70.

Figure 20:
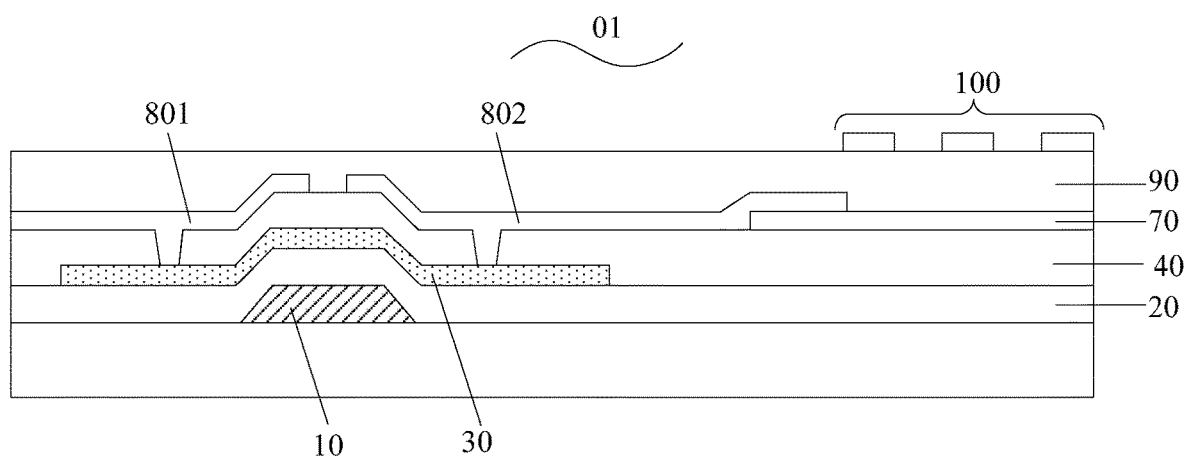
FIG. 20 schematically illustrates a configuration when forming a pattern of a common electrode and a pattern of a passivation layer on the basis of FIG. 19.

Based on the mentioned above, considering that the Advanced Super Dimension Switch technology can improve the display quality of the display panel and have advantages such as high resolution, high transmissivity, low power consumption, high aperture ratio, low chromatic aberration, no push mura, etc., as illustrated in FIG. 20, the method further comprises: forming the pattern of the passivation layer 90 and the pattern of the common electrode 100.

Figure 10:
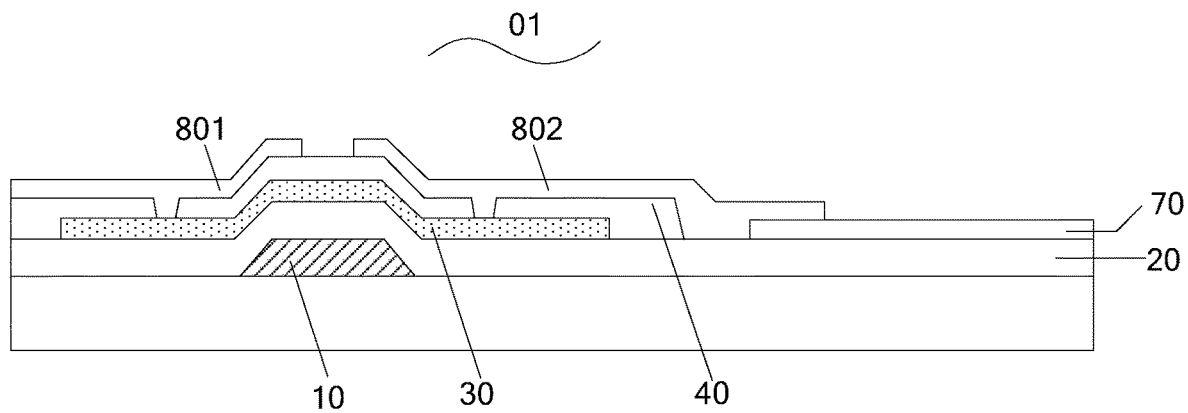

An embodiment of the invention further provides an array substrate 01, as illustrated in FIG. 10 and FIG. 19. The array substrate 01 comprises: a base substrate, a pattern of a gate electrode 10, a pattern of a gate insulation layer 20, a pattern of a metal oxide semiconductor active layer 30, a pattern of an etch stop layer 40, a pattern of a pixel electrode 70, and a pattern of a source electrode 801 and a pattern of a drain electrode 802 sequentially disposed on the base substrate.

As an example, the pattern of the etch stop layer 40 comprises a first via hole 401 and a second via hole 402, the first via hole 401 and the second via hole 402 are configured for respectively connecting the pattern of the source electrode 801 and the pattern of the drain electrode 802 to the pattern of the metal oxide semiconductor active layer 30; the pattern of the pixel electrode 70 is connected to the pattern of the source electrode 801 or the pattern of the drain electrode 802, and the pattern of the source electrode 801 or the pattern of the drain electrode 802 connected to the pattern of the pixel electrode 70 partly overlays the pattern of the pixel electrode 70.

It can be contemplated that, the array substrate may further comprise a gate line and a gate connection disposed in the same layer as the pattern of the gate electrode 10, as well as a date lines and a data connection disposed in the same layer as the pattern of the source electrode 801 and the pattern of the drain electrode 802 and so on. Further, the pattern of the gate electrode 10, the gate line, the gate connection, the pattern of the source electrode 801 and the pattern of the drain electrode 802, the data line and the data connection and the like can all be made of a material with low resistance and strong activity such as Cu.

As Cu has rich reserves in nature and it is conductive material with relatively low resistance, the materials of the pattern of the gate electrode 10, the pattern of the source electrode 801 and the pattern of the drain electrode 802 in the embodiment of the invention are preferably Cu.

On one hand, it is possible to fabricate an array substrate with a higher resolution, a better performance and a relatively big size by using the pattern of the metal oxide semiconductor active layer 30 and electrodes having low resistances. On the other hand, comparing with the conventional solutions of forming the pattern of the source electrode 801 and the pattern of the drain electrode 802 first and then forming the pattern of the pixel electrode 70, by forming the pattern of the pixel electrode 70 first and then forming the pattern of the source electrode 801 and the pattern of the drain electrode 802, it is possible to prevent the problem that the pattern of the pixel electrode 70 failing to connect to the pattern of the source electrode 801 and the pattern of the drain electrode 802 caused by the surface oxidation of the pattern of the source electrode 801 and the pattern of the drain electrode 802 due to the strong activity of the material having a low resistance.

As illustrated in FIG. 10, the pattern of the etch stop layer 40 is not present under the pattern of the pixel electrode 70.

Thus, during the process of forming the pattern of the etch stop layer 40, it is possible to use photoresist of the photoresist-completely-retained region disposed above the pattern of the etch stop layer 40 to form the pattern of the photoresist 50 simply by way of a curing process, thereby allowing the process to be relatively simple and requiring no extra patterning processes.

Further, considering that the Advanced Super Dimension Switch technology can improve the display quality of the display panel and have advantages such as high resolution, high transmissivity, low power consumption, high aperture ratio, low chromatic aberration, no push mura, etc., as illustrated in FIG. 11 and FIG. 20, the array substrate 01 may further comprise the passivation layer 90 and the pattern of the common electrode 100 disposed above the pattern of the source electrode 801 and the pattern of the drain electrode 802.

An embodiment of the invention further provides a display device comprising the array substrate 01.

The display device provided in the embodiment of the invention is for example a LCD panel, a LCD TV, a LCD display, a digital photo-frame, a mobile phone, tablet PC or any products or components with a display function.

It is noted that, though the example of connecting the pattern of the drain electrode 802 to the pattern of the pixel electrode 70 in the thin film transistor is described in the above embodiments of the invention and drawings, those skilled in the art will understand that, due to the interchangeability of structure and form of the pattern of the source electrode 801 and the pattern of the drain electrode 802 in the thin film transistor, it is also possible to connect the pattern of the source electrode 801 to the pattern of the pixel electrode 70 and connect the pattern of the drain electrode 802 to the data line, which is an equivalent variation in the embodiment of the invention.

What is described above is related to the illustrative embodiments of the disclosure only and not limitative to the scope of the disclosure; the scopes of the disclosure are defined by the accompanying claims.

This application claims the priority of Chinese Patent Application No. 201410373777.2, filed on Jul. 31, 2014, and which application is incorporated herein by reference.

What is claimed is:

1. A method for fabricating an array substrate, comprising:
    forming a pattern of a gate electrode, a pattern of a gate insulation layer, and a pattern of a metal oxide semiconductor active layer on a base substrate, wherein the pattern of the metal oxide semiconductor active layer is on a surface of the pattern of the gate insulation layer away from the pattern of the gate electrode;
    forming an etch stop layer on a surface of the pattern of the metal oxide semiconductor active layer away from the pattern of the gate insulation layer;
    after forming the etch stop layer, forming a pattern of a pixel electrode on the surface of the pattern of the gate insulation layer, wherein the pattern of the pixel electrode and the pattern of the metal oxide semiconductor active layer are on a same surface of the pattern of the gate insulation layer and are both in direct contact with the pattern of the gate insulation layer; and forming a pattern of a source electrode and a pattern of a drain electrode after the formation of the pattern of the pixel electrode, wherein the pattern of the pixel electrode is connected to the pattern of the metal oxide semiconductor active layer through the pattern of the source electrode or through the pattern of the drain electrode.

2. The method of claim 1, wherein after forming the etch stop layer and before forming the pattern of the pixel electrode, the method further comprises:
performing a single patterning process on the etch stop layer to form a pattern of the etch stop layer comprising a first via hole and a second via hole; and
forming a pattern of a photoresist layer which is located outside of a pixel region and overlays at least the first via hole and the second via hole,
wherein both the first via hole and the second via hole are filled with the pattern of the photoresist layer, and the pattern of the photoresist layer is not formed in the pixel region.

3. The method of claim 2, wherein the forming the pattern of the pixel electrode and forming the pattern of the source electrode and the pattern of the drain electrode comprises:
forming the pattern of the pixel electrode in the pixel region on the substrate having the pattern of the photoresist layer formed thereon, and removing the pattern of the photoresist layer; and
forming the pattern of the source electrode and the pattern of the drain electrode on the substrate having the pattern of the pixel electrode formed thereon, wherein the pattern of the source electrode is connected to the pattern of the metal oxide semiconductor active layer through the first via hole, the pattern of the drain electrode is connected to the pattern of the metal oxide semiconductor active layer through the second via hole, and the pattern of the source electrode or the pattern of the drain electrode is connected to the pattern of the pixel electrode.

4. The method of claim 3, wherein the forming the pattern of the pixel electrode disposed in the pixel region on the substrate having the pattern of the photoresist layer formed thereon and removing the pattern of the photoresist layer comprises:
sequentially forming a transparent conductive layer and a second photoresist layer on the substrate having the pattern of the photoresist layer formed thereon;
exposing and developing the substrate having the second photoresist layer formed thereon by using a mask to form a second-photoresist-completely-retained region and a second-photoresist-completely-removed region, wherein the second-photoresist-completely-retained region corresponds to the pixel region, and the second-photoresist-completely-removed region corresponds to remaining regions;
removing the transparent conductive layer in the second-photoresist-completely-removed region by way of an etching process to form the pattern of the pixel electrode and to expose the pattern of the photoresist layer; and
removing the pattern of the photoresist layer and photoresist in the second-photoresist-completely-retained region by way of a peeling process.

5. The method of claim 2, wherein the performing the single patterning process on the etch stop layer to form the pattern of the etch stop layer comprising the first via hole and the second via hole and forming the pattern of the photoresist layer which is located outside the pixel region and overlays at least the first via hole and the second via hole comprises:
forming a first photoresist layer on the etch stop layer;
exposing and developing the base substrate having the first photoresist layer formed thereon by using a mask, and forming a first-photoresist-completely-retained region and a first-photoresist-completely-removed region, wherein the first-photoresist-completely-removed region at least corresponds to the pixel region and regions having the first via hole and the second via hole, and the first-photoresist-completely-retained region corresponds to remaining regions;
removing the etch stop layer in the first-photoresist-completely-removed region by way of an etching process and forming the pattern of the etch stop layer; and
curing photoresist in the first-photoresist-completely-retained region to fill the first via hole and the second via hole with the cured photoresist, such that the pattern of the photoresist layer which is disposed outside the pixel region and overlays at least the first via hole and the second via hole is formed.

6. The method of claim 5, wherein the removing the etch stop layer in the first-photoresist-completely-removed region by way of the etching process comprises:
removing the etch stop layer in the first-photoresist-completely-removed region by a wet-etching process, allowing a diameter of the first via hole to be larger than a gap between first-photoresist-completely-retained regions corresponding to the first via hole, and allowing a diameter of the second via hole to be larger than a gap between first-photoresist-completely-retained regions corresponding to the second via hole.

7. The method of claim 5, wherein the curing the photoresist in the first-photoresist-completely-retained region to fill the first via hole and the second via hole with the cured photoresist, such that the pattern of the photoresist layer which is disposed outside the pixel region and overlays at least the first via hole and the second via hole is formed comprises:
curing the photoresist in the first-photoresist-completely-retained region at a temperature of 150-180° C. for 130-200 seconds to fill the first via hole and the second via hole with the cured photoresist, such that the pattern of the photoresist layer which is disposed outside the pixel region and overlays at least the first via hole and the second via hole is formed.

8. The method of claim 1, wherein after forming the pattern of the pixel electrode and before forming the pattern of the source electrode and the pattern of the drain electrode, the method further comprises:
performing a single patterning process on the etch stop layer, and forming a pattern of the etch stop layer comprising a first via hole and a second via hole.

9. The method of claim 8, wherein the forming the pattern of the source electrode and the pattern of the drain electrode comprises:
forming the pattern of the source electrode and the pattern of the drain electrode on the substrate having the pattern of the pixel electrode formed thereon, wherein the pattern of the source electrode is connected to the pattern of the metal oxide semiconductor active layer through the first via hole, the pattern of the drain electrode is connected to the pattern of the metal oxide semiconductor active layer through the second via hole, and the pattern of the source electrode or the pattern of the drain electrode is connected to the pattern of the pixel electrode.

10. The method of claim 1, further comprising: forming a pattern of a passivation layer and a pattern of a common electrode.

11. The method of claim 1, wherein materials of the pattern of the gate electrode, the pattern of the source electrode and the pattern of the drain electrode are Cu.

12. The method of claim 1, wherein the array substrate functions as a TFT array substrate in a liquid crystal device, wherein the pattern of the pixel electrode and a pattern of a common electrode are both arranged on the TFT array substrate.

* * * * *